(12) United States Patent
Sandoh et al.

(10) Patent No.: US 11,495,466 B2
(45) Date of Patent: Nov. 8, 2022

(54) PROCESSING METHOD OF WAFER

(71) Applicant: DISCO CORPORATION, Tokyo (JP)

(72) Inventors: Hideyuki Sandoh, Tokyo (JP); Minoru Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 60 days.

(21) Appl. No.: 17/061,966

(22) Filed: Oct. 2, 2020

(65) Prior Publication Data

US 2021/0104408 A1 Apr. 8, 2021

(30) Foreign Application Priority Data

Oct. 7, 2019 (JP) .............................. JP2019-184656

(51) Int. Cl.
| | |
|---|---|
| B23K 26/06 | (2014.01) |
| H01L 21/3065 | (2006.01) |
| B23K 37/04 | (2006.01) |
| B23K 26/36 | (2014.01) |

(52) U.S. Cl.
CPC .......... *H01L 21/3065* (2013.01); *B23K 26/06* (2013.01); *B23K 26/36* (2013.01); *B23K 37/04* (2013.01)

(58) Field of Classification Search
CPC ........ B23K 26/06; B23K 26/36; B23K 37/04; B23K 26/362; H01L 21/3065; H01L 21/3081; H01L 21/78; H01L 22/12
USPC ...... 216/41, 47, 48; 438/714, 717, 719, 723, 438/725, 709, 715
See application file for complete search history.

(56) References Cited

U.S. PATENT DOCUMENTS

| | | | | |
|---|---|---|---|---|
| 2003/0219660 | A1* | 11/2003 | Ito | G03F 7/40 430/311 |
| 2016/0056049 | A1* | 2/2016 | Lin | H01L 21/6708 438/748 |
| 2017/0299960 | A1* | 10/2017 | Parker | G03F 1/50 |

FOREIGN PATENT DOCUMENTS

JP 2016207737 A 12/2016

\* cited by examiner

*Primary Examiner* — Lan Vinh
(74) *Attorney, Agent, or Firm* — Greer Burns & Crain Ltd.

(57) ABSTRACT

A processing method of a wafer includes a resist film coating step of coating either one surface of a front surface and a back surface with a resist film containing an ultraviolet absorber, a laser beam irradiation step of irradiating the side of the one surface with a laser beam absorbed by the wafer and removing part of the wafer and the resist film along planned dividing lines, a plasma etching step of supplying a gas in a plasma state to the side of the one surface and removing an exposed region of the wafer exposed along the planned dividing lines through plasma etching, and a check step of irradiating plural positions on the side of the one surface of the wafer with ultraviolet rays and detecting light emission of the resist film to measure the thickness of the resist film and check a coating state of the resist film.

5 Claims, 11 Drawing Sheets

PROCESSING METHOD OF WAFER

BACKGROUND OF THE INVENTION

Field of the Invention

The present invention relates to a processing method of a wafer in which plasma etching is executed for the wafer on which devices are formed on the front surface side and the wafer is processed.

DESCRIPTION OF THE RELATED ART

It is known that a wafer is split by a cutting blade or laser beam when the wafer on which a device is formed in each of regions marked out by plural planned dividing lines set in a lattice manner on the front surface side is divided along the respective planned dividing lines to manufacture device chips. However, in the case of splitting the wafer by the cutting blade or laser beam, the planned dividing lines need to be sequentially processed one by one. Therefore, there is a problem that the processing time of the wafer becomes long with the wafer in which the number of planned dividing lines is comparatively large.

Thus, as an efficient splitting method of a wafer, plasma dicing has been devised in which all planned dividing lines are simultaneously processed by executing plasma etching for the wafer for which the region other than the planned dividing lines is covered by a resist film. However, the cost becomes very high when patterning of the resist film is executed by using an expensive stepper and so forth. Thus, as a method for patterning the resist film more inexpensively, a method has been devised in which a water-soluble resin film containing an ultraviolet absorber is used as the resist film and patterning of this resist film is executed by a laser beam.

Specifically, first, the whole of the front surface of a wafer is coated with the water-soluble resin film (i.e. resist film) containing the ultraviolet absorber. Next, by executing irradiation with a laser beam having a wavelength in the ultraviolet region along planned dividing lines, part of the resist film and part of the front surface side of the wafer are removed by ablation processing along the planned dividing lines. Thereby, the patterning of the resist film is executed (for example, refer to Japanese Patent Laid-open No. 2016-207737).

SUMMARY OF THE INVENTION

However, the above-described resist film is almost transparent to visible light and therefore it is difficult to visually distinguish whether or not the resist film is formed on the wafer. If plasma etching is executed for the wafer in the state in which the resist film is not formed partly or is not formed at all, processing failures such as damage on a device and unevenness of the thickness of the device chip occur. The present invention is made in view of this problem and intends to detect processing failure or suppress the occurrence of processing failure in the case of executing plasma etching for a wafer with use of a resist film.

In accordance with an aspect of the present invention, there is provided a processing method of a wafer on which a device is formed in each of a plurality of regions marked out by a plurality of planned dividing lines set to intersect each other on the side of a front surface. The processing method includes a resist film coating step of coating either one surface of the front surface and a back surface located on the opposite side to the front surface with a resist film containing an ultraviolet absorber and a laser beam irradiation step of irradiating the side of the one surface coated with the resist film with a laser beam having such a wavelength as to be absorbed by the wafer and removing part of the wafer and the resist film along the planned dividing lines. The processing method includes also a plasma etching step of supplying a gas in a plasma state to the side of the one surface and removing an exposed region of the wafer exposed along the planned dividing lines through plasma etching after the laser beam irradiation step and a check step of irradiating a plurality of positions on the side of the one surface of the wafer with ultraviolet rays and detecting light emission of the resist film that absorbs the ultraviolet rays to measure the thickness of the resist film at each of the positions and check a coating state of the resist film after the resist film coating step.

Preferably, the check step includes a post-etching check step executed after the plasma etching step, and whether or not a film thickness insufficiency region in which the thickness of the resist film is smaller than a first threshold exists is detected in the post-etching check step.

Furthermore, preferably, the check step includes a pre-etching check step executed after the resist film coating step and before the laser beam irradiation step and the plasma etching step, and the resist film coating step is executed again if a film thickness insufficiency region in which the thickness of the resist film is smaller than a second threshold is detected in the pre-etching check step.

Moreover, preferably, the one surface is the front surface on which the device is formed, and the side of the front surface is coated with the resist film in the resist film coating step.

The processing method of a wafer according to the aspect of the present invention includes the resist film coating step of coating the one surface of the wafer with the resist film containing the ultraviolet absorber and the check step of detecting light emission of the resist film to measure the thickness of the resist film at each of plural positions on the wafer and check the coating state of the resist film after the resist film coating step. Whether the resist film properly coats the wafer can be checked by the check step. For example, in the case of executing the check step after the plasma etching step, it can be checked whether the plasma etching has been executed for the wafer in the state in which the resist film is not formed partly or is not formed at all. Therefore, the device estimated to be damaged and a device chip estimated to have become uneven in the thickness can be detected. Moreover, in the case of executing the check step after the resist film coating step and before the laser beam irradiation step and the plasma etching step, it is possible to prevent the situation in which the plasma etching is executed for the wafer in the state in which the resist film is not formed partly or is not formed at all. Therefore, processing failures such as damage on the device and unevenness of the thickness of the device chip can be suppressed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
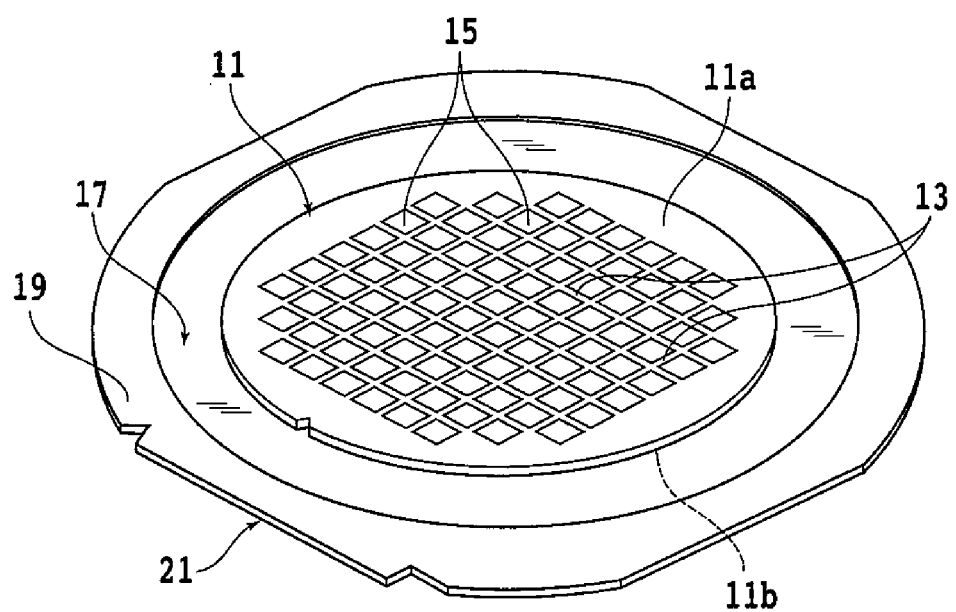
FIG. 1 is a perspective view of a wafer and so forth.

Embodiments according to an aspect of the present invention will be described with reference to the accompanying drawings. First, a wafer 11 processed in a first embodiment will be described. FIG. 1 is a perspective view of the wafer 11 and so forth. The wafer 11 has a circular disc shape and includes a front surface 11a having a substantially circular shape and a back surface 11b that has a substantially circular shape and is located on the opposite side to the front surface 11a. Plural planned dividing lines 13 are set in such a manner as to intersect each other on the side of the front surface 11a of the wafer 11.

A device 15 such as an integrated circuit (IC), a large scale integration (LSI) circuit, or a light emitting diode (LED) is formed in each of plural regions marked out by the plural planned dividing lines 13. The wafer 11 of the present embodiment has a circular-disc-shaped substrate 11c formed of silicon and a functional layer 15a (see FIG. 6A and FIG. 6B) that is disposed on the substrate 11c and is located on the side of the front surface 11a. The functional layer 15a is a multilayer interconnect layer in which interlayer insulating films formed of a low dielectric constant material (what is called Low-k material) and metal interconnect layers are alternately stacked.

Regions corresponding to the planned dividing lines 13 in the functional layer 15a are lower than regions corresponding to the devices 15 and test element groups (TEG) 15b (see FIG. 6A and FIG. 6B) formed of a metal are discretely formed in these regions along the planned dividing lines 13. Although the substrate 11c in the present embodiment is composed of a semiconductor material such as silicon, there is no limit on the material, shape, structure, size, and so forth of the substrate 11c. Similarly, there is no limit also on the kind, quantity, shape, structure, size, arrangement, and so forth of the devices 15.

When the wafer 11 is processed, a wafer unit 21 composed of the wafer 11, a dicing tape 17, and an annular frame 19 is formed as illustrated in FIG. 1. The dicing tape 17 is a circular tape having a diameter larger than the diameter of the wafer 11. The dicing tape 17 has a stacking structure of a base layer and an adhesion layer (glue layer), for example. The base layer is formed of a resin such as polyolefin (PO) and the adhesion layer formed of a resin with adhesiveness, such as an ultraviolet (UV)-curable resin, is formed on the whole or part of one surface of the base layer.

The wafer 11 is stuck to a substantially central part of the base layer with the intermediary of the adhesion layer and one surface of the annular frame 19 formed of a metal is stuck to the peripheral part of the base layer with the intermediary of the adhesion layer. Thereby, the wafer unit 21 in which the wafer 11 is supported by the frame 19 with the intermediary of the dicing tape 17 is formed. The dicing tape 17 is not limited to the stacking structure of the base layer and the adhesion layer. For example, the dicing tape 17 may have only the base layer. In this case, by executing thermal compression bonding of the base layer to the wafer 11 and so forth, the dicing tape 17 is stuck to the wafer 11 and so forth and the wafer unit 21 is formed.

Figure 2:
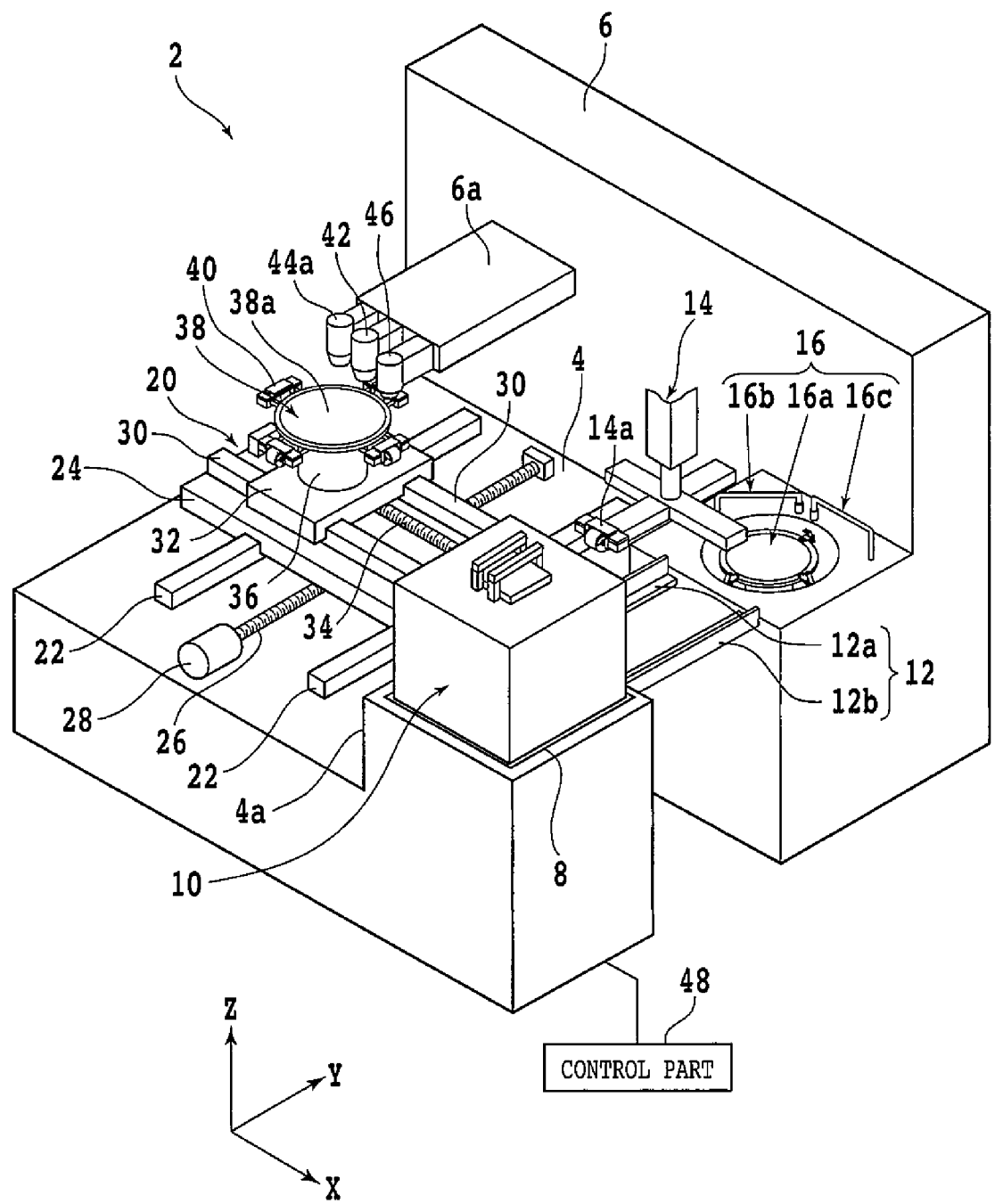
FIG. 2 is a perspective view of a laser processing apparatus.

The wafer 11 is conveyed to a laser processing apparatus to be processed in the form of the wafer unit 21. FIG. 2 is a perspective view of a laser processing apparatus 2. In FIG. 2, part of constituent elements of the laser processing apparatus 2 is illustrated by a functional block. Furthermore, in the following description, an X-axis direction (processing feed direction), a Y-axis direction (indexing feed direction), and a Z-axis direction (vertical direction, height direction) are perpendicular to each other. The laser processing apparatus 2 includes a base 4 that supports each structure. A protruding part 4a is disposed in such a manner as to protrude in the Z-axis direction at a corner part of the base 4. A space is formed inside the protruding part 4a and a cassette elevator 8 that can rise and lower along the Z-axis direction is disposed in this space. A cassette 10 in which plural wafer units 21 are housed is placed on the upper surface of the cassette elevator 8.

A temporary placement mechanism 12 for temporarily placing the wafer 11 is disposed on one side of the protruding part 4a in the Y-axis direction. The temporary placement mechanism 12 includes a pair of guide rails 12a and 12b that get closer to or further away from each other while keeping the state of being parallel to the Y-axis direction. The temporary placement mechanism 12 adjusts the position of the wafer unit 21 in the X-axis direction to a predetermined position by sandwiching the wafer unit 21 in the X-axis direction. A conveying mechanism 14 that conveys the wafer unit 21 is disposed above the temporary placement mechanism 12.

The conveying mechanism 14 has a gripping part 14a for gripping part of the frame 19. The conveying mechanism 14 draws out the wafer unit 21 from the cassette 10 to the temporary placement mechanism 12 in the state in which the frame 19 is gripped by the gripping part 14a. A suction mechanism (not illustrated) that sucks and holds plural places on the frame 19 is disposed at the bottom part of the conveying mechanism 14. The wafer unit 21 sucked and held by the suction mechanism is conveyed to an applying-cleaning unit 16 and a chuck table 38 that will be described later by the conveying mechanism 14.

The applying-cleaning unit 16 is disposed on one side of the temporary placement mechanism 12 in the Y-axis direction. The applying-cleaning unit 16 has a circular cylindrical space and a spinner table 16a that can rotate in the state of sucking and holding the wafer unit 21 is disposed in this circular cylindrical space. A rotational drive source (not illustrated) such as a motor that rotates the spinner table 16a is coupled to the lower part of the spinner table 16a. An applying nozzle 16b that jets a water-soluble resin 23 (see FIG. 3) to which an ultraviolet absorber is added is disposed near the spinner table 16a. As the ultraviolet absorber, a benzophenone-based, benzotriazole-based, triazine-based, or benzoate-based ultraviolet absorber is used, for example. Furthermore, as the water-soluble resin 23, polyvinyl alcohol (PVA), polyethylene glycol (PEG), or polyethylene oxide (PEO) is used, for example.

A cleaning nozzle 16c (see FIG. 2) is disposed at a different position from the applying nozzle 16b near the spinner table 16a. The cleaning nozzle 16c jets binary fluid obtained by mixing water and air, for example. A horizontal movement mechanism 20 is disposed on the front surface (upper surface) of the base 4 located on one side in the X-axis direction with respect to the applying-cleaning unit 16. The horizontal movement mechanism 20 includes a pair of Y-axis guide rails 22 that are fixed to the upper surface of the base 4 and are parallel to the Y-axis direction. A Y-axis moving table 24 is slidably attached to the Y-axis guide rails 22.

A nut part (not illustrated) is disposed on the back surface side (lower surface side) of the Y-axis moving table 24, and a Y-axis ball screw 26 parallel to the Y-axis guide rails 22 is joined to this nut part in such a manner as to be rotatable. A Y-axis pulse motor 28 is coupled to one end part of the Y-axis ball screw 26. When the Y-axis ball screw 26 is rotated by the Y-axis pulse motor 28, the Y-axis moving table 24 moves in the Y-axis direction along the Y-axis guide rails 22. A pair of X-axis guide rails 30 parallel to the X-axis direction are disposed on the front surface (upper surface) of the Y-axis moving table 24.

An X-axis moving table 32 is slidably attached to the X-axis guide rails 30. A nut part (not illustrated) is disposed on the back surface side (lower surface side) of the X-axis moving table 32, and an X-axis ball screw 34 parallel to the X-axis guide rails 30 is joined to this nut part in such a manner as to be rotatable. An X-axis pulse motor (not illustrated) is coupled to one end part of the X-axis ball screw 34. When the X-axis ball screw 34 is rotated by the X-axis pulse motor, the X-axis moving table 32 moves in the X-axis direction along the X-axis guide rails 30.

A table base 36 is disposed on the front surface side (upper surface side) of the X-axis moving table 32. The chuck table 38 for sucking and holding the wafer 11 is disposed at the upper part of the table base 36. Four clamps 40 that fix the frame 19 from four sides are disposed around the chuck table 38. The bottom part of the chuck table 38 is coupled to a rotational drive source (not illustrated) such as a motor disposed inside the table base 36, and the chuck table 38 can rotate around the rotation axis parallel to the Z-axis direction. The upper surface of the chuck table 38 functions as a holding surface 38a that sucks and holds the wafer unit 21.

The holding surface 38a is connected to a suction source (not illustrated) such as an ejector through a suction path (not illustrated) and so forth formed inside the chuck table 38 and the table base 36. When the suction source is operated, a negative pressure is generated for the holding surface 38a. At an end part of the base 4 on one side in the Y-axis direction, a wall-shaped support structure 6 that extends along the Z-axis direction is disposed. A support arm 6a that protrudes toward the center side of the base 4 is disposed on the support structure 6. A light collector 42 that emits a laser beam downward is disposed at the tip part of this support arm 6a.

A laser oscillator (not illustrated) for generating a pulsed laser beam is optically connected to the light collector 42. The light collector 42, the laser oscillator, and so forth configure a laser beam irradiation unit. The laser beam emitted from the light collector 42 has such a wavelength as to be absorbed by the wafer 11. The wavelength of this laser beam is a wavelength in the ultraviolet region (for example, 355 nm). Furthermore, the average output power of this laser beam is adjusted to 0.5 W, for example, and the repetition frequency of the pulse of this laser beam is adjusted to 200 kHz, for example.

Figure 4:
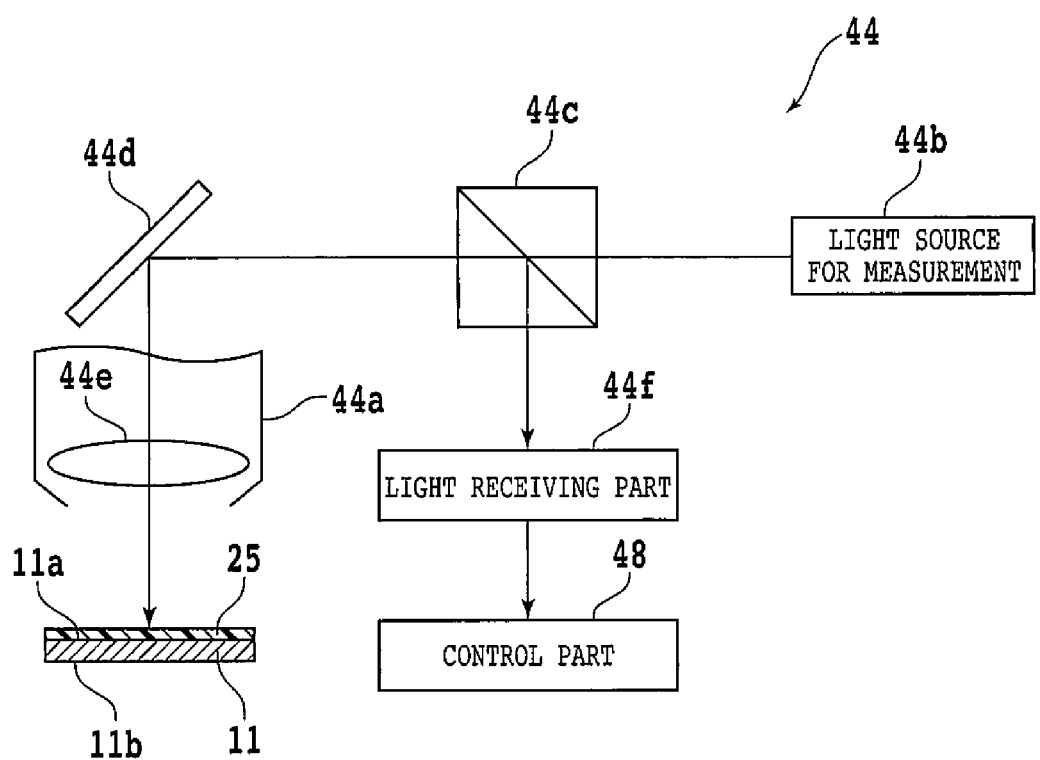
FIG. 4 is an outline diagram of a film thickness measuring instrument.

A measuring head 44a of a film thickness measuring instrument 44 is disposed on one side of the light collector 42 in the X-axis direction. Here, the film thickness measuring instrument 44 will be described with reference to FIG. 4. FIG. 4 is an outline diagram of the film thickness measuring instrument 44. In FIG. 4, part of constituent elements of the film thickness measuring instrument 44 is illustrated by functional blocks. The film thickness measuring instrument 44 has a light source 44b for measurement. The light source 44b for measurement is an ultraviolet (UV) light that executes irradiation with ultraviolet rays, for example. However, the light source 44b for measurement may be a laser oscillator that executes irradiation with a laser beam having lower output power than the laser beam emitted from the light collector 42 and a wavelength in the ultraviolet region. Part of the ultraviolet rays emitted from the light source 44b for measurement is transmitted through a half mirror 44c and is reflected by a mirror 44d to be incident on a collecting lens 44e disposed in the measuring head 44a. The wafer unit 21 held by the holding surface 38a is disposed below the measuring head 44a.

The wafer unit 21 illustrated in FIG. 4 is held by the holding surface 38a in such a manner that the front surface (one surface) 11a of the wafer 11 is exposed. A resist film 25 containing the ultraviolet absorber is formed on the front surface 11a of the wafer 11. The ultraviolet rays emitted from the collecting lens 44e are incident on the resist film 25 on the side of the front surface 11a in such a manner as to be collected on the side of the front surface 11a of the wafer 11. The ultraviolet absorber in the resist film 25 absorbs the ultraviolet rays and emits light. For example, the ultraviolet absorber absorbs the ultraviolet rays and emits fluorescence in a predetermined band (for example, from 360 nm to 560 nm inclusive).

The fluorescence goes through the collecting lens 44e, the mirror 44d, and the half mirror 44c sequentially and is incident on a light receiving part 44f. The light receiving part 44f has an imaging element (not illustrated) such as a complementary metal oxide semiconductor (CMOS) image sensor or charge coupled device (CCD) image sensor, for example. The fluorescence incident on the light receiving part 44f is subjected to photoelectric conversion by the imaging element and is converted to a voltage signal corresponding to the emission intensity. This voltage signal is sent to a control part 48 (see FIG. 2) to be described later and the thickness of the resist film 25 according to the voltage signal is calculated.

Figure 5:
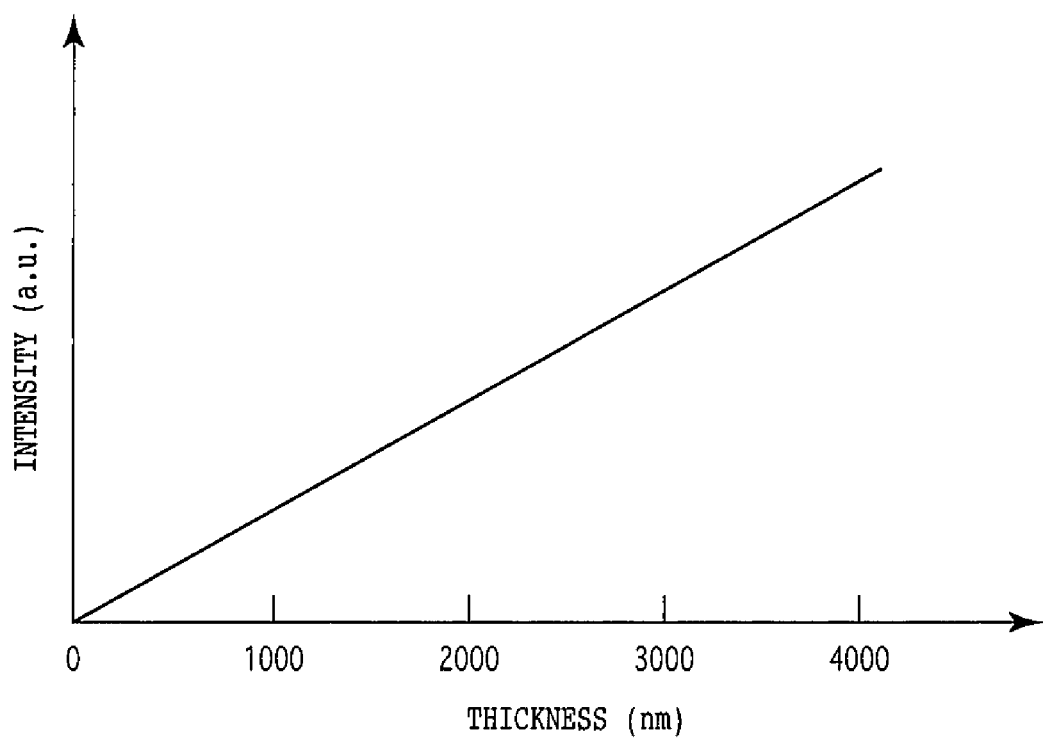
FIG. 5 is a graph illustrating the outline of the relationship between the thickness of a resist film and the emission intensity.

The ultraviolet absorber is evenly dispersed in the resist film 25. Therefore, when the resist film 25 is irradiated with ultraviolet rays with predetermined output power, the emission intensity of the fluorescence becomes higher when the resist film 25 is thicker. FIG. 5 is a graph illustrating the outline of the relationship between the thickness of the resist film 25 and the emission intensity. The abscissa axis of FIG. 5 indicates the thickness (nm) of the resist film 25 and the ordinate axis of FIG. 5 indicates the intensity (a.u.) of the fluorescence incident on the light receiving part 44f. When the resist film 25 is absent (that is, the thickness is zero), the intensity of the fluorescence is zero. As the thickness of the resist film 25 increases, the intensity of the fluorescence increases. The thickness of the resist film 25 is measured at plural positions on the side of the front surface 11a. In this case, for example, the horizontal movement mechanism 20 is operated and the front surface 11a is scanned with ultraviolet rays emitted from the light source 44b for measurement. As the measurement method of the thickness of the resist film 25, the thickness of the resist film 25 may be measured based on the correspondence relationship between the emission intensity of the fluorescence and a predetermined wavelength band as disclosed in Japanese Patent Laid-open No. 2012-104532.

Here, referring back to FIG. 2, other constituent elements of the laser processing apparatus 2 will be described. An imaging head 46 of a camera unit for imaging the wafer 11 is disposed on the opposite side to the measuring head 44a across the light collector 42. This camera unit is a visible light camera unit (not illustrated) or infrared (IR) camera unit (not illustrated) and is used for alignment and kerf check of the wafer 11, for example. Furthermore, the laser processing apparatus 2 has the control part 48 connected to the respective constituent elements such as the conveying mechanism 14, the applying-cleaning unit 16, the horizontal movement mechanism 20, the chuck table 38, the laser beam irradiation unit, the film thickness measuring instrument 44, and the camera unit. The control part 48 controls the respective constituent elements according to the series of steps necessary for processing of the wafer 11.

The control part 48 is configured by a computer including a processing apparatus such as a central processing unit (CPU) and a storing apparatus such as a flash memory. By causing the processing apparatus to operate in accordance with software such as a program stored in the storing apparatus, the control part 48 functions as specific means in which the software and the processing apparatus (hardware resources) cooperate. The control part 48 has a calculating section (not illustrated) that calculates the thickness of the resist film 25 according to the voltage signal from the light receiving part 44f. This calculating section is a program stored in the storing apparatus, for example. The calculating section reads out the correspondence relationship between the intensity of fluorescence and the thickness of the resist film 25 stored in a partial region of the storing apparatus and calculates the thickness of the resist film 25 based on this correspondence relationship. The correspondence relationship between the intensity of fluorescence and the thickness of the resist film 25 read out from the storing apparatus by the calculating section is an expression to identify the graph illustrated in FIG. 5, a table obtained in advance, or the like, for example.

Figure 10:
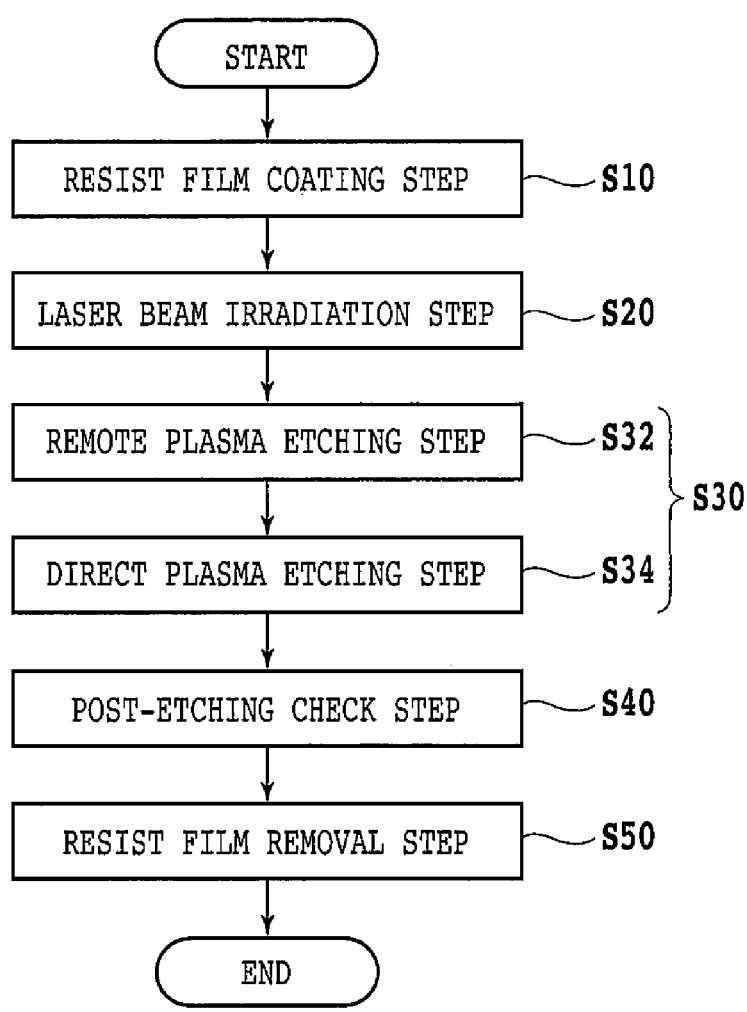
FIG. 10 is a flowchart of a processing method of a wafer according to a first embodiment.

Next, processing methods of the wafer 11 will be described. FIG. 10 is a flowchart of the processing method of the wafer 11 according to the first embodiment. In the present embodiment, first, the front surface 11a of the wafer 11 is coated with the resist film 25 by using the applying-cleaning unit 16 (resist film coating step (S10)). In the resist film coating step (S10), first, the wafer unit 21 is conveyed to the applying-cleaning unit 16, and the wafer unit 21 is sucked and held by the spinner table 16a in such a manner that the front surface (one surface) 11a is exposed.

Figure 3:
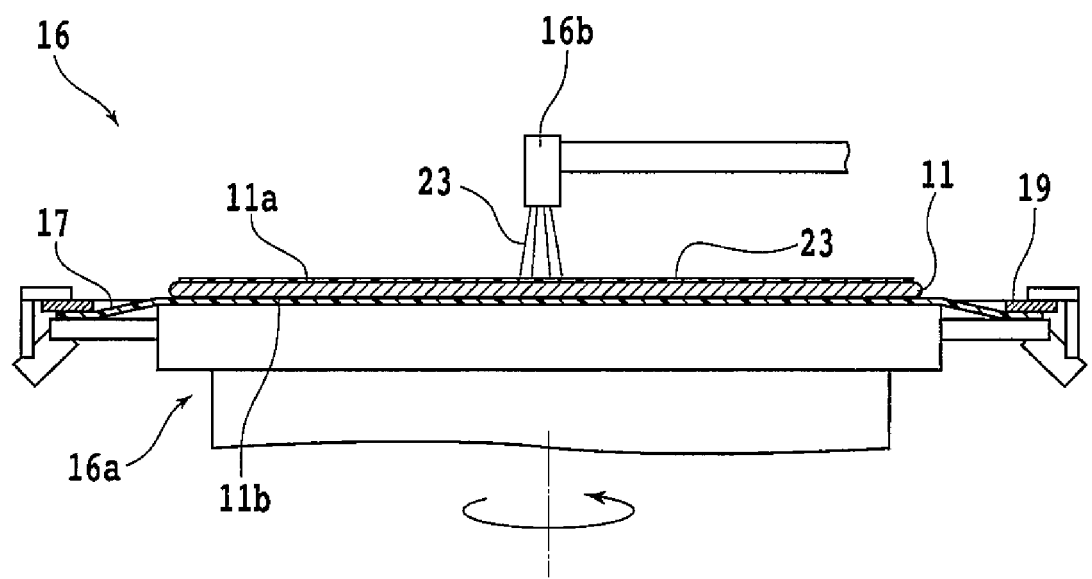
FIG. 3 is a diagram illustrating how a water-soluble resin is applied onto one surface of the wafer.

Next, in the state in which the spinner table 16a is rotated, the water-soluble resin 23 in a liquid state containing the ultraviolet absorber is jetted from the applying nozzle 16b. FIG. 3 is a diagram illustrating how the water-soluble resin 23 is applied onto one surface of the wafer 11. The water-soluble resin 23 spreads outward due to a centrifugal force and the water-soluble resin 23 is applied on the whole of the front surface 11a of the wafer 11. After the application, the water-soluble resin 23 is dried and thereby the water-soluble resin 23 becomes the resist film 25. That is, the whole of the front surface 11a is coated with the resist film 25 containing the ultraviolet absorber.

Figure 6A:
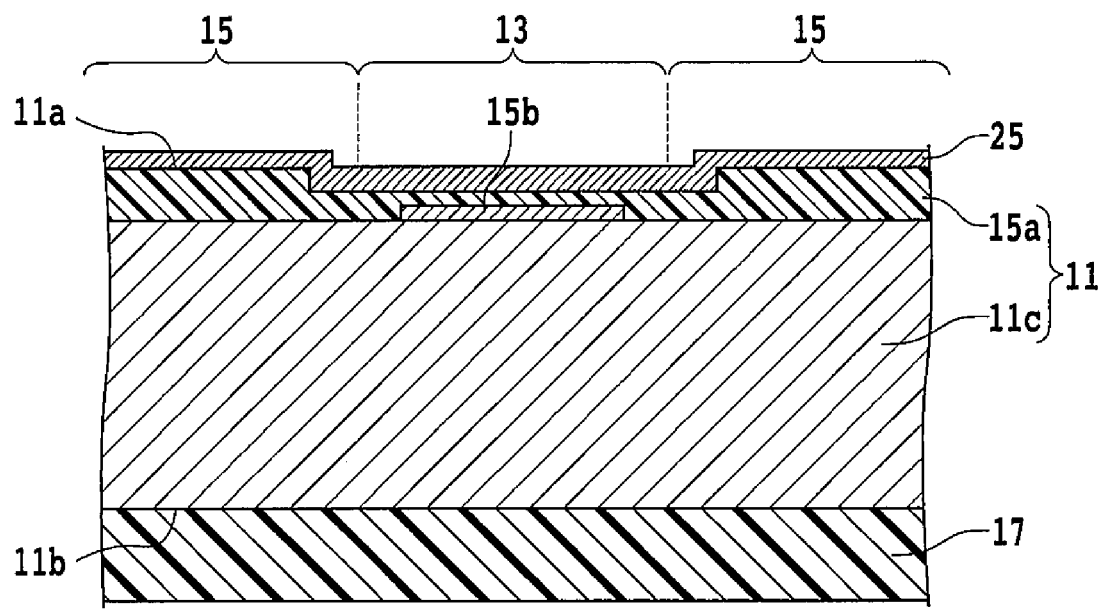
FIG. 6A is a sectional view illustrating one example of the wafer after a resist film coating step.

FIG. 6A is a sectional view illustrating one example of the wafer 11 after the resist film coating step (S10). The resist film 25 illustrated in FIG. 6A is formed with an even thickness in the region corresponding to the devices 15 and the planned dividing lines 13. However, a hole 25a or an application unevenness (a region in which the thickness is large or small partly) is formed in the resist film 25 in some cases due to factors such as the viscosity of the water-soluble resin 23, the wettability of the front surface 11a, and the number of rotations of the spinner table 16a per unit time.

Figure 6B:
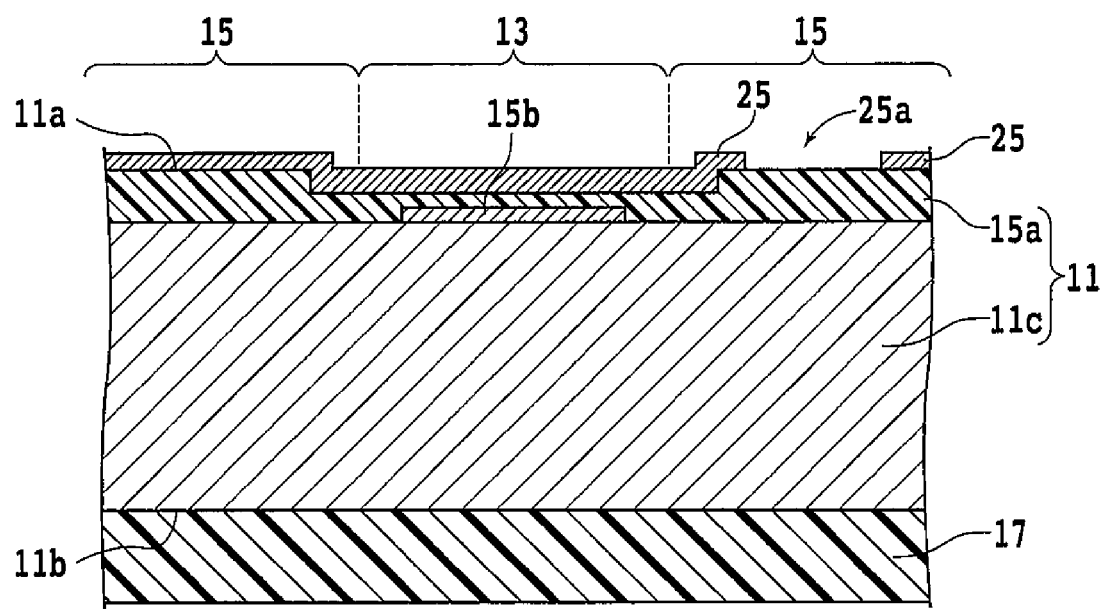
FIG. 6B is a sectional view illustrating another example of the wafer after the resist film coating step.

FIG. 6B is a sectional view illustrating another example of the wafer 11 after the resist film coating step (S10). In the resist film 25 illustrated in FIG. 6B, the hole 25a is formed over the device 15. If the hole 25a exists, this becomes a cause of the occurrence of processing failures such as damage on the device 15 and unevenness of the thickness of the device chip in a plasma etching step to be described later. In the present embodiment, after the resist film coating step (S10), the side of the front surface 11a is irradiated with a laser beam by using the laser beam irradiation unit with the light collector 42 and so forth, and the resist film 25 and part of the wafer 11 are removed along the planned dividing lines 13 (laser beam irradiation step (S20)).

Figure 7A:
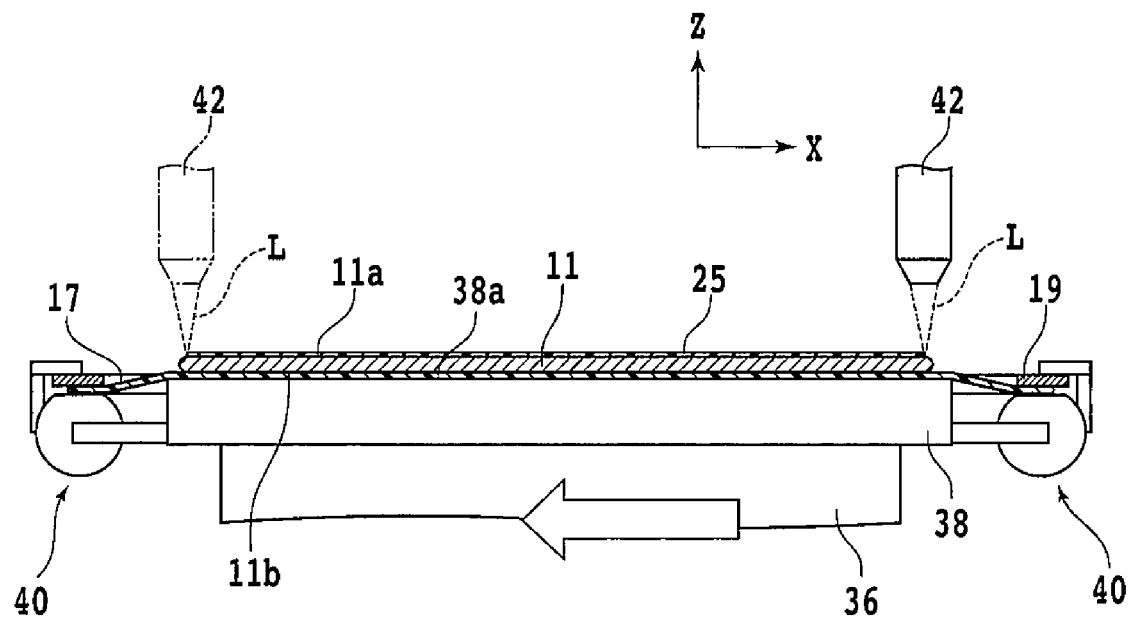
FIG. 7A is a diagram illustrating a laser beam irradiation step.

FIG. 7A is a diagram illustrating the laser beam irradiation step (S20). In the laser beam irradiation step (S20), first, the wafer unit 21 is conveyed to the chuck table 38. Then, by using the visible light camera unit, alignment of the wafer 11 is executed and one planned dividing line 13 is positioned parallel to the X-axis direction. Next, in the state in which irradiation with the laser beam from the light collector 42 is executed, the light collector 42 and the chuck table 38 are relatively moved along the X-axis direction. Thereby, the resist film 25 and part of the wafer 11 are subjected to ablation processing and are removed along the one planned dividing line 13.

After the irradiation with the laser beam is executed along the one planned dividing line 13, indexing feed of the chuck table 38 is executed. Then, irradiation with the laser beam is similarly executed along another planned dividing line 13 adjacent to the planned dividing line 13 after the processing in the Y-axis direction. After irradiation with the laser beam is executed along all planned dividing lines 13 parallel to the X-axis direction, the chuck table 38 is rotated by 90 degrees. Then, irradiation with the laser beam is similarly executed along the remaining planned dividing lines 13 for which processing has not been executed. Thereby, the resist film 25 and part of the wafer 11 are subjected to ablation processing along all planned dividing lines 13 and grooves 11d that are exposed regions of the wafer 11 are formed on the side of the front surface 11a.

Figure 7B:
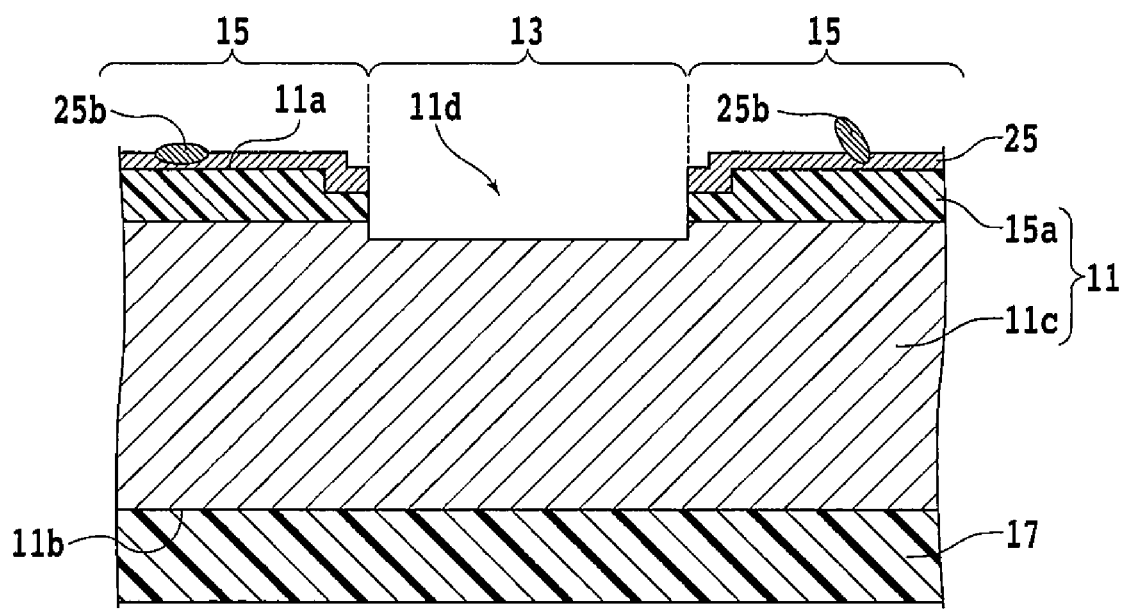
FIG. 7B is a sectional view of the wafer after the laser beam irradiation step.

FIG. 7B is a sectional view of the wafer 11 after the laser beam irradiation step (S20). Debris 25b generated in association with the ablation processing often adheres to the resist film 25 after the laser beam irradiation step (S20), and a heat affected layer (not illustrated) arising from alteration due to heat is often formed in the groove 11d. After the laser beam irradiation step (S20), a plasma etching apparatus (not illustrated) set separately from the laser processing apparatus 2 is used to supply a gas in a plasma state to the side of the front surface 11a and execute etching of the wafer 11 (plasma etching step (S30)).

The plasma etching apparatus has a chamber (not illustrated) formed of a metal. In the chamber, a door part (not illustrated) that serves as a conveyance path of the wafer unit 21 is disposed. Furthermore, an evacuation apparatus (not illustrated) for evacuating the inside is connected to the chamber. A table base (not illustrated) is disposed in the chamber. In the table base, an electrostatic chuck (not illustrated) that holds the wafer unit 21 and a bias electrode (not illustrated) that is electrically isolated from the electrostatic chuck and is connected to a high-frequency power supply (not illustrated) through a blocking capacitor (not illustrated) are disposed.

An applicator (not illustrated) for generating remote plasma is disposed on the ceiling part of the chamber located above the table base. The applicator includes a gas supply pipe (not illustrated) connected to the ceiling part of the chamber substantially perpendicularly, a wave-guide pipe (not illustrated) connected to the gas supply pipe in such a manner as to be substantially orthogonal to the gas supply pipe, and a high-frequency generation source (not illustrated) disposed on one end side of the wave-guide pipe. To the gas supply pipe, an inert gas supply source (not illustrated) having an inert gas of helium (He), argon (Ar), or the like, a first fluorine-based gas supply source having a first fluorine-based gas ($SF_6$), and a second fluorine-based gas supply source having a second fluorine-based gas ($C_4F_8$) are connected.

In the plasma etching step (S30), first, the wafer unit 21 is conveyed to the electrostatic chuck and the wafer unit 21 is held by the electrostatic chuck (not illustrated) in such a manner that the front surface 11a is exposed. In the present embodiment, by use of the plasma etching apparatus, first a remote plasma etching step (S32) is executed for the wafer 11 and subsequently a direct plasma etching step (S34) is executed.

Figure 8A:
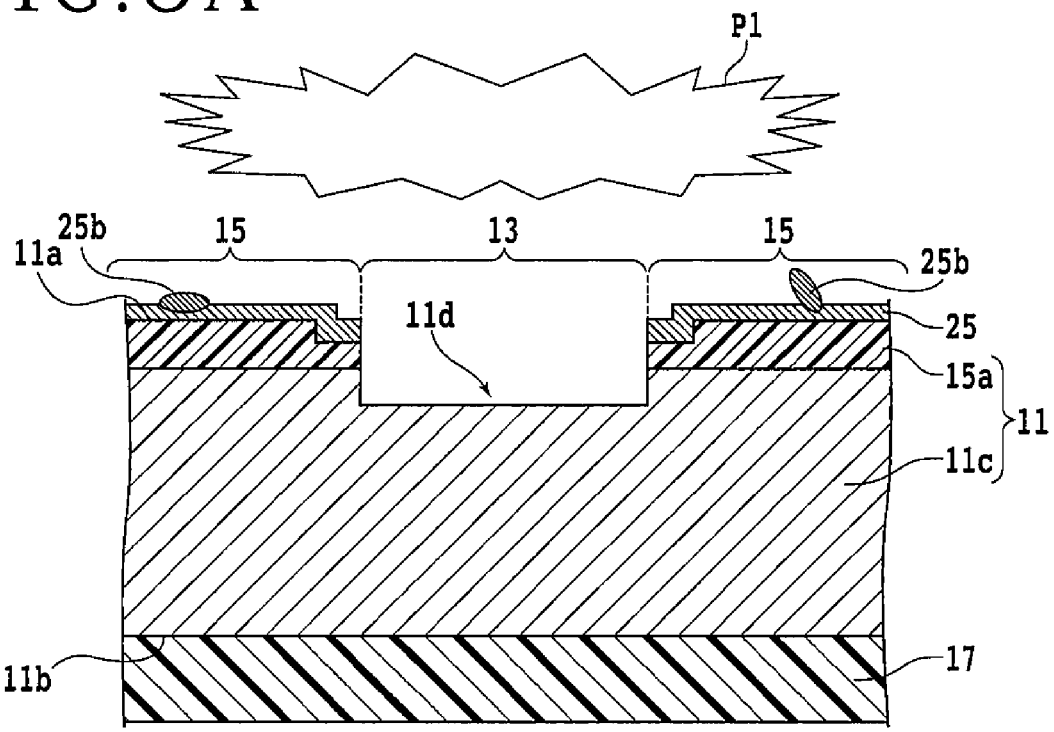
FIG. 8A is a diagram illustrating a remote plasma etching step.

In the remote plasma etching step (S32), the inert gas and the $SF_6$ gas are supplied to the gas supply pipe and these gases are irradiated with a microwave of 2.45 GHz and 2000 W through the wave-guide pipe. The gases turned to plasma by the microwave (remote plasma P1) reach the wafer 11 from the applicator and etch the bottom parts and side parts of the grooves 11d. FIG. 8A is a diagram illustrating the remote plasma etching step (S32). In the remote plasma etching step (S32), the heat affected layer at the bottom parts and the side parts of the grooves 11d and the debris 25b that adheres to the inside of the grooves 11d are removed.

After the remote plasma etching step (S32), the inside of the chamber is evacuated. Furthermore, the bottom parts of the grooves 11d are etched and removed by plasma generated in the chamber (direct plasma P2) (direct plasma etching step (S34)). In the direct plasma etching step (S34), the substrate 11c is split by etching the bottom parts of the grooves 11d by what is called the Bosch process. Specifically, the $SF_6$ gas is supplied from the first fluorine-based gas supply source to the chamber for a first predetermined time and high-frequency power of 13.56 MHz and 300 W is applied to the bias electrode. The substrate 11c is isotropically etched by the $SF_6$ gas turned to plasma.

Figure 8B:
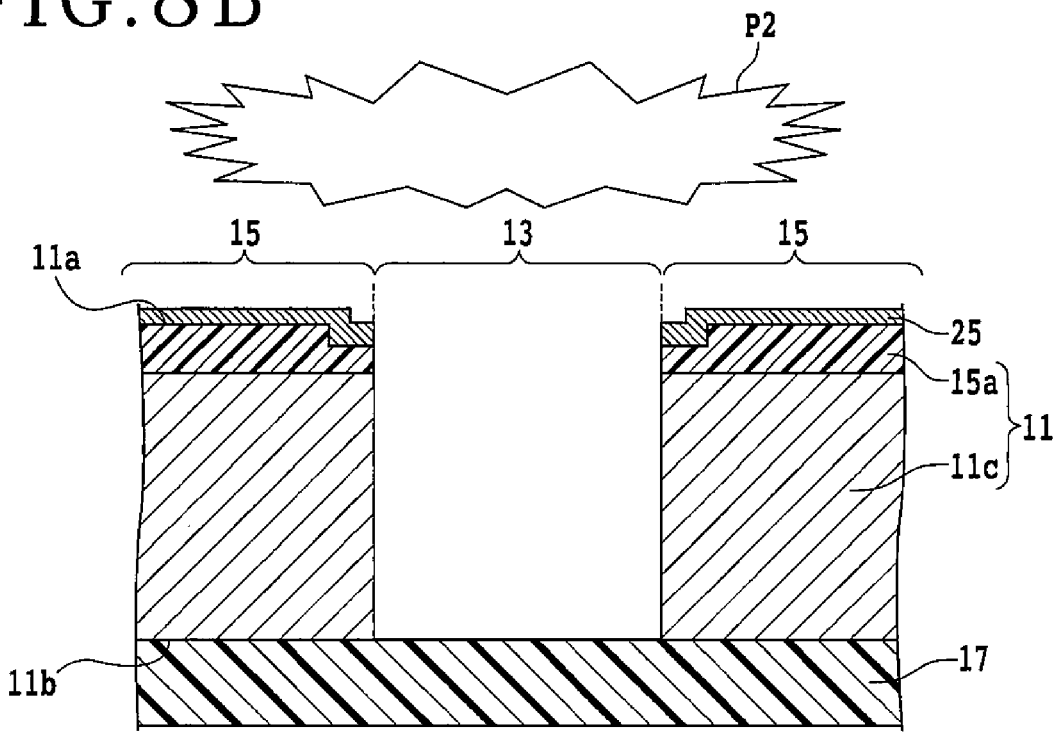
FIG. 8B is a sectional view of the wafer and so forth split by a direct plasma etching step.

Subsequently, the supply of the $SF_6$ gas from the first fluorine-based gas supply source is stopped and the $C_4F_8$ gas is supplied from the second fluorine-based gas supply source to the chamber. The high-frequency power of 13.56 MHz and 300 W is applied to the bias electrode. When the $C_4F_8$ gas is supplied for a second predetermined time in this state, a protective film is formed on the sidewalls of the grooves 11d by the $C_4F_8$ gas turned to plasma. Subsequently, the supply of the $C_4F_8$ gas is stopped. Thereafter, in the state in which the above-described high-frequency power is applied to the bias electrode, the supply of the $SF_6$ gas for the first predetermined time and the supply of the $C_4F_8$ gas for the second predetermined time are alternately repeated. Due to the formation of the protective film on the sidewalls of the grooves 11d, the bottom parts of the grooves 11d are selectively etched by the $SF_6$ gas turned to plasma and finally the substrate 11c is split. FIG. 8B is a sectional view of the wafer 11 and so forth split by the direct plasma etching step (S34).

Figure 9:
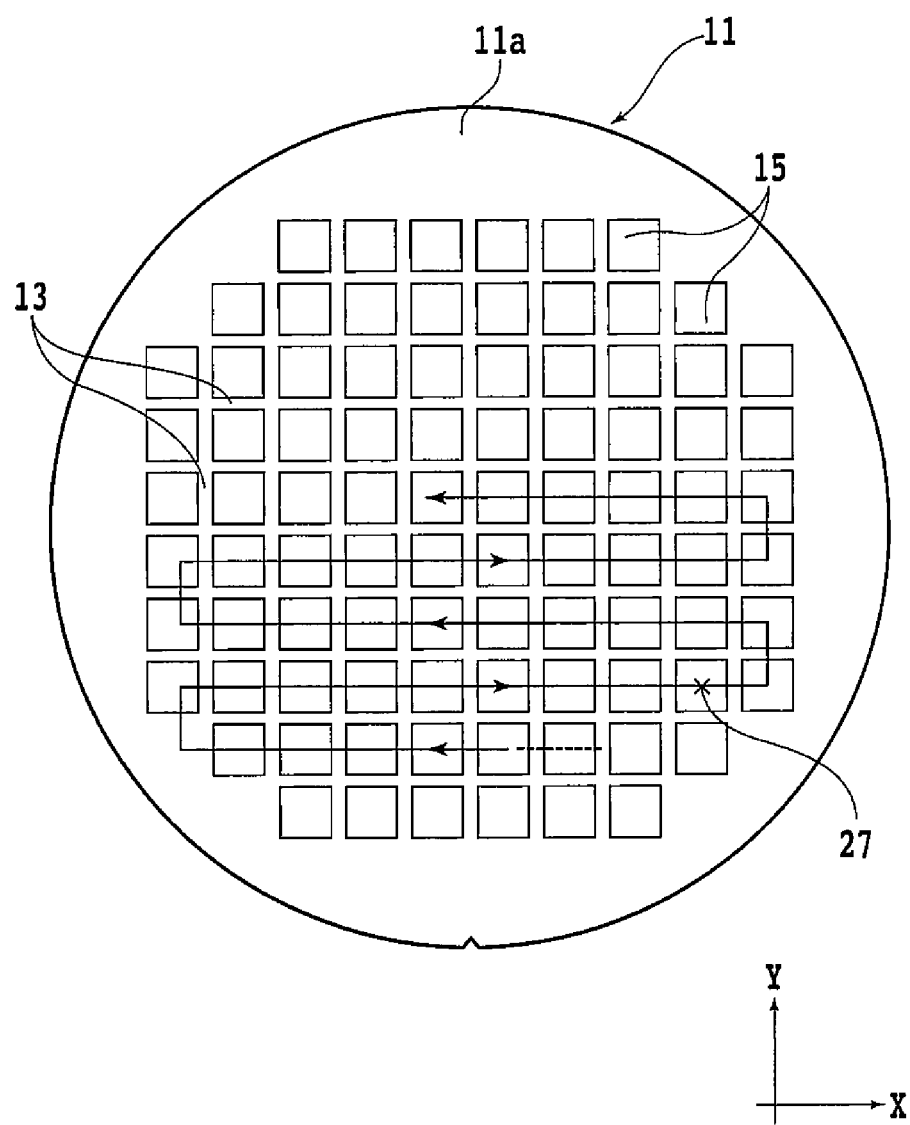
FIG. 9 is a diagram illustrating a post-etching check step.

After the plasma etching step (S30), the coating state of the resist film 25 is checked by detecting light emission of the resist film 25 by using the film thickness measuring instrument 44 (post-etching check step (S40)). FIG. 9 is a diagram illustrating the post-etching check step (S40). In the post-etching check step (S40), first, the wafer unit 21 is taken out from the plasma etching apparatus and is conveyed to the laser processing apparatus 2, and the wafer unit 21 is held by the chuck table 38 in such a manner that the front surface 11a is oriented upward.

Subsequently, in the state in which the side of the front surface 11a is irradiated with ultraviolet rays from the light source 44b for measurement, the chuck table 38 is moved by the horizontal movement mechanism 20. Thereby, the resist film 25 is scanned. For example, the irradiation with the ultraviolet rays is executed in such a manner that the ultraviolet rays traverse the respective devices 15. Then, the control part 48 checks the thickness of the resist film 25 based on fluorescence from the resist film 25. Because spin coating is executed in the resist coating step (S10), the thickness of the resist film 25 tends to be smaller at the peripheral part of the wafer 11. Therefore, in the post-etching check step (S40), the time used for checking the peripheral part of the wafer 11 may be set longer than the time used for checking the central part of the wafer 11. Specifically, regarding the plural devices 15 located on the peripheral side of the wafer 11 (for example, 6 pieces×4 of the devices 15 located on the respective peripheral sides of X direction and Y direction in FIG. 9), the devices 15 are scanned with the ultraviolet rays plural times in such a manner that the irradiation position reciprocates on the devices 15.

The thickness of the resist film 25 is at least 2 μm and at most 6 μm, for example, before the plasma etching step (S30). However, after the plasma etching step (S30), the thickness decreases due to the etching. Thus, in the present embodiment, 0.1 μm is set as a first threshold and the control part 48 detects whether or not a film thickness insufficiency region 27 in which the thickness of the resist film 25 is smaller than this first threshold exists in the region excluding the planned dividing lines 13 on the side of the front surface 11a.

For example, the film thickness insufficiency region 27 is classified into an attention region in which the thickness of the resist film 25 is larger than 0 μm and is equal to or smaller than the first threshold and a processing failure region in which the thickness of the resist film 25 is 0 μm. In the attention region and the surrounding thereof, there is a possibility that a region in which the thickness of the resist film 25 is 0 μm exists. Furthermore, in the processing failure region, there is a possibility that the device 15 is damaged.

The control part 48 causes a monitor (not illustrated) to display a warning indicating that the wafer 11 in which the processing failure region has been detected is a defective wafer. Instead of issuing the warning indicating that the wafer 11 is a defective wafer, the control part 48 may issue a warning indicating that the device 15 located in a region in which the processing failure region has been detected is defective. Furthermore, the control part 48 may cause a monitor of the laser processing apparatus 2 to display the distribution of the attention region and the processing failure region.

In the present embodiment, it can be checked whether the plasma etching has been executed for the wafer 11 in the state in which the resist film 25 is not formed partly or is not formed at all. Therefore, the device 15 estimated to be damaged and the device chip estimated to have become uneven in the thickness can be detected. After the post-etching check step (S40), the resist film 25 is removed (resist film removal step (S50)). In the resist film removal step (S50), first, the wafer unit 21 is conveyed from the chuck table 38 to the spinner table 16a. Then, the wafer unit 21 is held in such a manner that the side of the front surface 11a is oriented upward, and the spinner table 16a is rotated and binary fluid is jetted from the cleaning nozzle 16c. Thereby, the resist film 25 formed of the water-soluble resin 23 dissolves to be removed. After the wafer 11 is cleaned, the wafer unit 21 is conveyed to the cassette 10.

Figure 11:
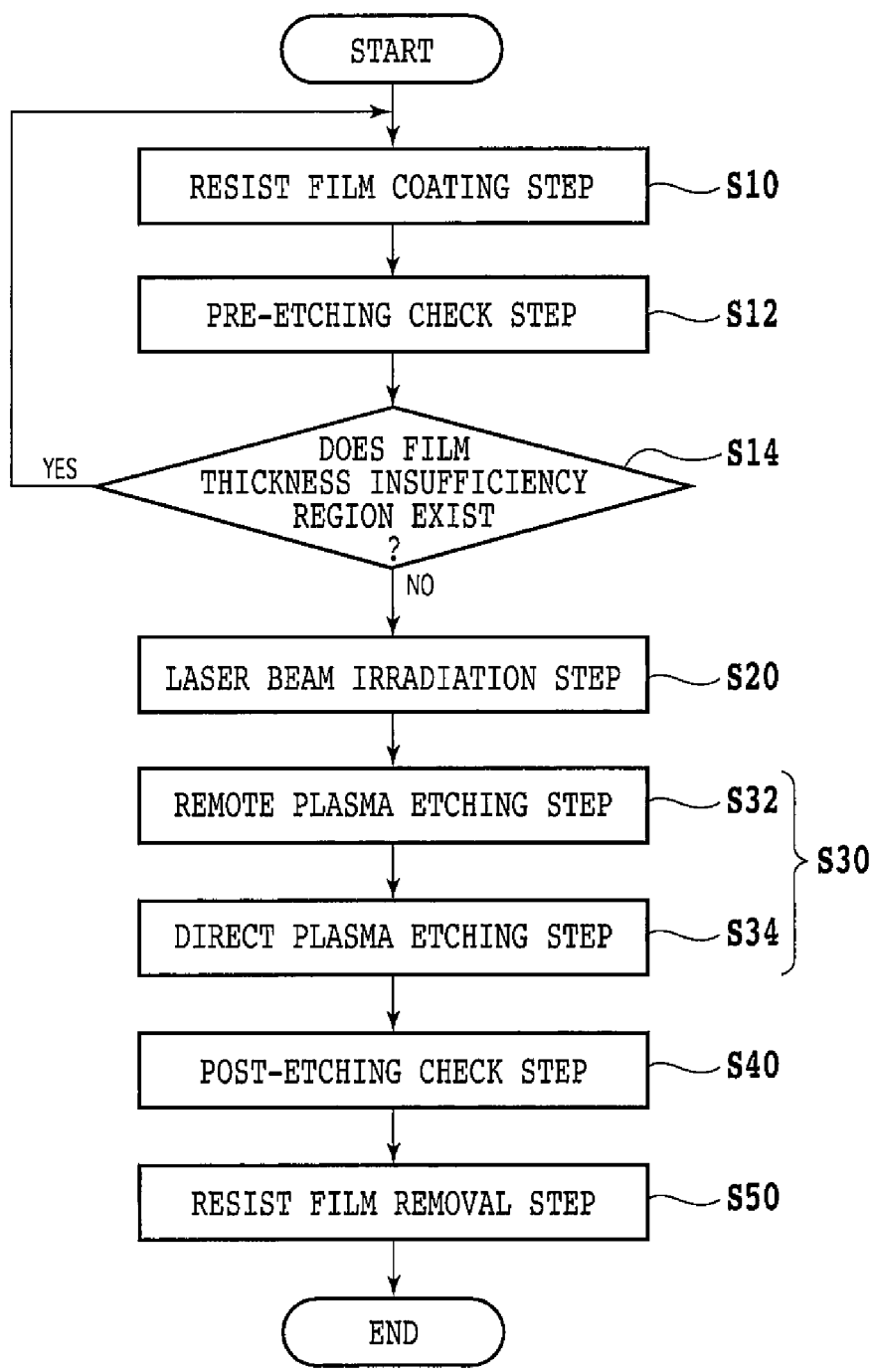
FIG. 11 is a flowchart of a processing method of a wafer according to a second embodiment.

Next, a processing method of the wafer 11 according to a second embodiment will be described. The processing method in the second embodiment further includes a pre-etching check step (S12) executed after the resist film coating step (S10) and before the laser beam irradiation step (S20) and the plasma etching step (S30) in addition to the post-etching check step (S40). FIG. 11 is a flowchart of the processing method of the wafer 11 according to the second embodiment. Also in the pre-etching check step (S12), the thickness of the resist film 25 is checked at plural positions on the wafer 11 by using the film thickness measuring instrument 44 similarly to the post-etching check step (S40).

In the pre-etching check step (S12), it is checked whether or not the film thickness insufficiency region 27 in which the thickness of the resist film 25 is smaller than a second threshold (for example, 2 μm) exists. In consideration of decrease in the thickness of the resist film 25 due to the plasma etching, the second threshold is set larger than the first threshold. If the film thickness insufficiency region 27 in which the thickness of the resist film 25 is smaller than the second threshold is detected in the pre-etching check step (S12) (YES in S14), the resist film coating step (S10) is executed again. In this case, the resist film 25 may be further formed on the existing resist film 25, or the resist film 25 may be formed again on the side of the front surface 11a after the existing resist film 25 is removed by the applying-cleaning unit 16.

In the pre-etching check step (S12), it is possible to prevent the situation in which the plasma etching step (S30) is executed for the wafer 11 in the state in which the resist film 25 is not formed partly or is not formed at all. Therefore, processing failures such as damage on the device 15 and unevenness of the thickness of the device chip can be suppressed. If the film thickness insufficiency region 27 in which the thickness of the resist film 25 is smaller than the second threshold is not detected by the control part 48 in the pre-etching check step (S12) (NO in S14), the processing method proceeds to the laser beam irradiation step (S20). The subsequent process is the same as the first embodiment.

Next, a third embodiment will be described. In the third embodiment, in the resist film coating step (S10), the resist film 25 is formed on the back surface (one surface) 11b instead of the front surface 11a. In this case, an infrared camera unit is used when alignment of the wafer 11 is executed in the laser beam irradiation step (S20). Furthermore, the plasma etching step (S30) and so forth executed for the side of the front surface 11a in the first and second embodiments are executed for the side of the back surface 11b. Besides, structures, methods, and so forth according to the above-described embodiments can be implemented with appropriate changes without departing from the range of the object of the present invention. For example, in the plasma etching step (S30), only the remote plasma etching step (S32) may be executed. In this case, after the resist film removal step (S50), the substrate 11c is divided by what is called stealth dicing, for example.

In the stealth dicing, irradiation with a laser beam having such a wavelength as to transmit through the wafer 11 is executed along the planned dividing lines 13 and thereby a modified layer that is fragile compared with the region that is not irradiated with the laser beam is formed. Thereafter, an external force or the like is given to split the wafer 11. Furthermore, the wafer 11 may be split by cutting the wafer 11 along the planned dividing lines 13 by using a cutting blade after the resist film removal step (S50) instead of the stealth dicing. Incidentally, the post-etching check step (S40) may be executed by not the above-described laser processing apparatus 2 but a measuring apparatus (not illustrated) having the horizontal movement mechanism 20, the table base 36, the chuck table 38, the film thickness measuring instrument 44, and so forth.

Moreover, a processing apparatus that is a processing apparatus (not illustrated) set separately from the laser processing apparatus 2 and has the applying-cleaning unit 16 in addition to the horizontal movement mechanism 20, the table base 36, the chuck table 38, the film thickness measuring instrument 44, and so forth may be used. For example, by using this processing apparatus, the resist film coating step (S10), the pre-etching check step (S12), the post-etching check step (S40), and the resist film removal step (S50) can be executed. Therefore, by using the processing apparatus and the laser processing apparatus 2 in combination, simultaneously with execution of the laser beam irradiation step (S20) for one wafer 11 by the laser processing apparatus 2, the post-etching check step (S40) and so forth can be execute for another wafer 11 by the processing apparatus. Accordingly, in this case, device chips can be efficiently manufactured.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method of a wafer on which a device is formed in each of a plurality of regions marked out by a plurality of planned dividing lines set to intersect each other on a side of a front surface, the processing method comprising:

a resist film coating step of coating either one surface of the front surface and a back surface located on an opposite side to the front surface with a resist film containing an ultraviolet absorber;

a laser beam irradiation step of irradiating, along the planned dividing lines, a side of the one surface coated with the resist film with a laser beam having such a wavelength as to be absorbed by the wafer and removing part of the wafer and the resist film along the planned dividing lines by an ablation process to form a resist pattern defined by the planned dividing lines;

a plasma etching step of supplying a gas in a plasma state to the side of the one surface and removing an exposed region of the wafer exposed along the planned dividing lines through plasma etching after the laser beam irradiation step; and a check step of irradiating a plurality of positions on the side of the one surface of the wafer with ultraviolet rays and detecting light emission of the resist film that absorbs the ultraviolet rays to measure a thickness of the resist film at each of the positions and check a coating state of the resist film after the resist film coating step.

2. The processing method of a wafer according to claim 1, wherein the check step includes a post-etching check step executed after the plasma etching step, and whether or not a film thickness insufficiency region in which the thickness of the resist film is smaller than a first threshold exists is detected in the post-etching check step.

3. The processing method of a wafer according to claim 1, wherein the check step includes a pre-etching check step executed after the resist film coating step and before the laser beam irradiation step and the plasma etching step, and the resist film coating step is executed again if a film thickness insufficiency region in which the thickness of the resist film is smaller than a second threshold is detected in the pre-etching check step.

4. The processing method of a wafer according to claim 1, wherein the one surface is the front surface on which the device is formed, and the side of the front surface is coated with the resist film in the resist film coating step.

5. The processing method of a wafer according to claim 1, wherein the resist film is measured in a thickness direction of the wafer.

* * * * *